United States Patent
Lee et al.

(10) Patent No.: US 7,919,371 B2
(45) Date of Patent: Apr. 5, 2011

(54) METHOD FOR FABRICATING NON-VOLATILE MEMORY DEVICE WITH CHARGE TRAPPING LAYER

(75) Inventors: Ki Hong Lee, Suwon-si (KR); Seung Ho Pyi, Yongin-si (KR); Ki Seon Park, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 323 days.

(21) Appl. No.: 12/139,623

(22) Filed: Jun. 16, 2008

(65) Prior Publication Data

US 2009/0163014 A1 Jun. 25, 2009

(30) Foreign Application Priority Data

Dec. 21, 2007 (KR) .................. 10-2007-0135869

(51) Int. Cl.
*H01L 21/336* (2006.01)
(52) U.S. Cl. .. 438/257; 438/292; 438/308; 257/E21.422

(58) Field of Classification Search .................. 438/257, 438/292, 308; 257/E21.422
See application file for complete search history.

(56) References Cited

U.S. PATENT DOCUMENTS

| 2007/0138576 A1 | 6/2007 | Mizukami et al. |
| 2007/0259497 A1 | 11/2007 | Wong et al. |

FOREIGN PATENT DOCUMENTS

| KR | 10-2001-0008844 | 2/2001 |
| KR | 10-2005-0061220 | 6/2005 |
| KR | 10-0753079 | 8/2007 |

*Primary Examiner* — Evan Pert
(74) *Attorney, Agent, or Firm* — Marshall, Gerstein & Borun LLP

(57) ABSTRACT

A method for fabricating a non-volatile memory device with a charge trapping layer wherein a tunneling layer, a charge trapping layer, a blocking layer, and a control gate electrode are formed on a semiconductor substrate. A temperature of the control gate electrode is increased by applying a magnetic field to the control gate electrode. The blocking layer is densified by allowing the increased temperature to be transferred to the blocking layer contacting the control gate electrode.

15 Claims, 5 Drawing Sheets

METHOD FOR FABRICATING NON-VOLATILE MEMORY DEVICE WITH CHARGE TRAPPING LAYER

CROSS-REFERENCE TO RELATED APPLICATION

Priority to Korean patent application number 10-2007-0135869, filed on Dec. 21, 2007, the disclosure of which is incorporated by reference in its entirety, is claimed.

BACKGROUND OF THE INVENTION

The invention relates to semiconductor memory devices and, more particularly, to a method for fabricating a non-volatile memory device with a charge trapping layer.

Non-volatile memory devices, which are electrically programmable and erasable devices, are used mainly in electronic components that require data retention even when no power is supplied. Such non-volatile memory devices typically have a floating gate structure. According to the existence or nonexistence of charges in a floating gate, a program operation or an erase operation is performed. As the degree of integration of semiconductor memory devices has increased, non-volatile memory devices with new cell structures have been required. Such non-volatile memory devices with new cell structures include non-volatile memory devices with a charge trapping layer. Such non-volatile memory devices with a charge trapping layer are classified as silicon-oxide-nitride-oxide-silicon (SONOS) structures and metal-aluminum oxide-nitride-oxide-silicon (MANOS) structures, depending on the characteristics of the charge trapping layer. According to a bias voltage applied to non-volatile memory devices with such structures, charges are stored in or discharged from the charge trapping layer to electrically perform a program operation or an erase operation.

FIG. 1 illustrates a cross-sectional view of a conventional non-volatile memory device with a charge trapping layer 110. Referring to FIG. 1, the non-volatile memory device with the charge trapping layer 110 includes a tunneling layer 105, the charge trapping layer 110, a blocking layer 115, and a control gate electrode 120 stacked on a semiconductor substrate 100. The blocking layer 115 is disposed between the control gate electrode 120 and the charge trapping layer 110 and generally comprises an aluminum oxide ($Al_2O_3$) film. Since the quality of the aluminum oxide ($Al_2O_3$) film is not high and a grain size of the aluminum oxide ($Al_2O_3$) film is small, a leakage current may occur. When the non-volatile memory device is fabricated with the quality of the film not being sufficiently high, characteristics of data retention may be adversely affected. To address this limitation, a thermal treatment process is performed to increase (i.e., "densify") the quality of the film of the blocking layer 115, after the blocking layer 115 is deposited. A method for the film of the blocking layer 115 includes a process of depositing the blocking layer 115 at a high temperature ranging from approximately 600° C. to approximately 800° C., or a thermal treatment process performed at a high temperature after a deposition process. However, the thermal treatment process performed at the high temperature adversely affects a layer deposited below the blocking layer 115 or a profile of an impurity region formed in the semiconductor substrate 100. Also, temperature and run time of the thermal treatment process are limited to obtain the desired high-quality of the blocking layer 115 using the process of depositing the blocking layer 115 at the high temperature or the thermal treatment process after the deposition process. To address these limitations, a method is required, which can improve the characteristics of the film quality of the blocking layer 115 without affecting a layer below the blocking layer 115 or the semiconductor substrate 100, thereby improving the characteristics of the non-volatile memory device.

SUMMARY OF THE INVENTION

In one embodiment, a method for fabricating a non-volatile memory device includes: sequentially forming a tunneling layer, a charge trapping layer, a blocking layer, and a control gate electrode on a semiconductor substrate; and densifying the blocking layer by applying a magnetic field to the control gate electrode to increase a temperature of the control gate electrode.

The blocking layer preferably comprises one of an aluminum oxide film and a silicon oxide film.

The method preferably further includes preheating the semiconductor substrate after forming the control gate electrode.

The preheating preferably includes one of (a) heating through a furnace and (b) maintaining a temperature of the semiconductor substrate at a temperature ranging from approximately 200° C. to approximately 900° C. by heating a lower portion of the semiconductor substrate. The preheating may be performed in one of a reducing atmosphere, an oxidizing atmosphere, and an inert atmosphere.

Increasing of the temperature of the control gate electrode is preferably performed by disposing the semiconductor substrate on which the control gate electrode is formed in an induction heating apparatus; and forming a magnetic field by applying an alternating current to the control gate electrode disposed in the induction heating apparatus.

In another embodiment, a method for fabricating a non-volatile memory device with a charge trapping layer includes: forming a pattern on a semiconductor substrate, the pattern defining an interface between an amorphous insulating layer and a conductive layer; and densifying the amorphous insulating layer by applying a magnetic field to the conductive layer to increase a temperature of the conductive layer.

The pattern defining the interface between the amorphous insulating layer and the conductive layer may comprise the insulating layer and the conductive layer, which are sequentially deposited on the semiconductor substrate. Alternatively, the pattern defining the interface between the amorphous insulating layer and the conductive layer may comprise the conductive layer and the insulating layer, which are sequentially deposited on the semiconductor substrate. Alternatively, the pattern defining the interface between the amorphous insulating layer and the conductive layer may comprise the conductive layer, which comprises first and second conductive layers formed on the semiconductor substrate, and the insulating layer disposed between the first and second conductive layers.

DESCRIPTION OF SPECIFIC EMBODIMENTS

Hereinafter, a method for fabricating a non-volatile memory device with a charge trapping layer in accordance with the invention is described in detail with reference to the accompanying drawings.

Figure 1:
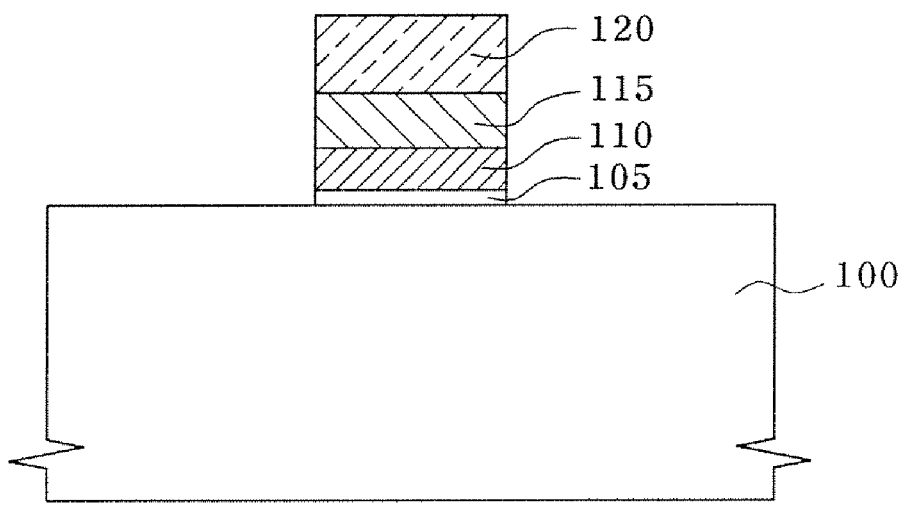
FIG. 1 illustrates a cross-sectional view of a conventional non-volatile memory device with a charge trapping layer.
Figure 2:
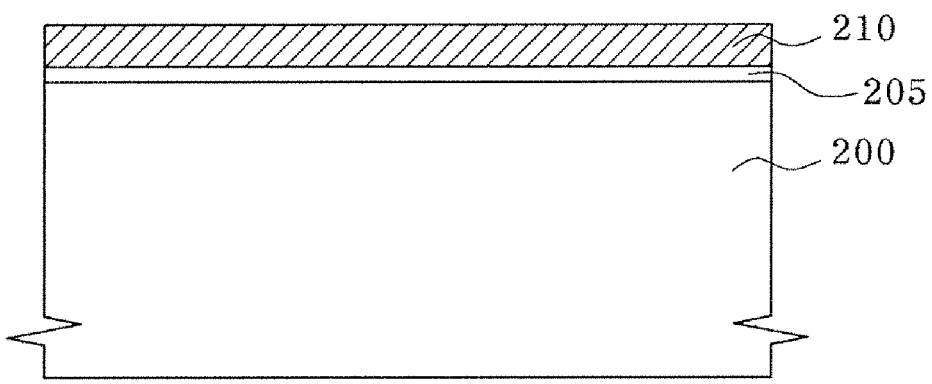
FIGS. 2 to 6 illustrate a method for fabricating a non-volatile memory device with a charge trapping layer according to one embodiment of the invention.

Referring to FIG. 2, a tunneling layer 205 is formed on a semiconductor substrate 200. The tunneling layer 205 allows charge carriers such as electrons or holes to be injected through tunneling into a charge trapping layer 210 at a predetermined bias voltage. The tunneling layer 205 is preferably and illustratively formed of silicon oxide ($SiO_2$), preferably by using a thermal oxidation method or a radical oxidation method, and preferably has a thickness ranging from approximately 20 Å to approximately 30 Å. The forming of the tunneling layer 205 is illustratively followed by an annealing process, preferably performed in a nitrous oxide ($N_2O$) gas atmosphere or a nitric oxide (NO) gas atmosphere to improve interfacial characteristics between the tunneling layer 205 and the semiconductor substrate 200. Then, the charge trapping layer 210, which is illustratively formed of silicon nitride, and preferably has a thickness ranging from approximately 20 Å to approximately 100 Å, is formed on the tunneling layer 205.

Figure 3:
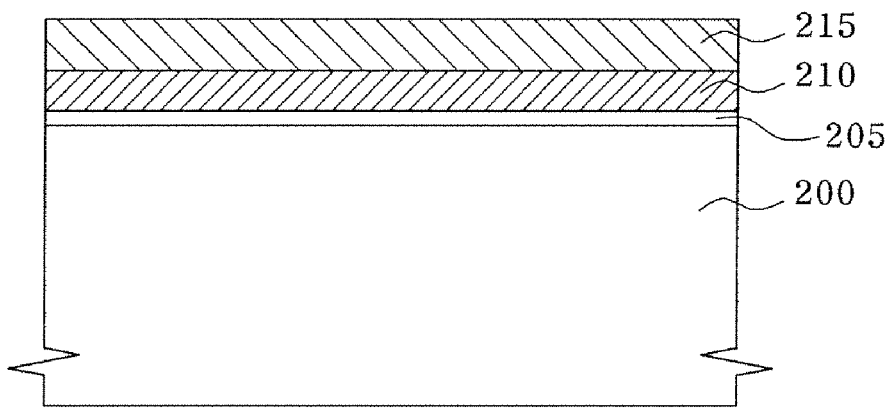

Referring to FIG. 3, a blocking layer 215 is formed on the charge trapping layer 210. The blocking layer 215 isolates the charge trapping layer 210 from a control gate electrode 220 of FIG. 4 to retain charges stored in the charge trapping layer 210. The blocking layer 215 is illustratively formed of aluminum oxide ($Al_2O_3$), and preferably has a thickness ranging from approximately 50 Å to approximately 300 Å. The blocking layer 215 is illustratively deposited at a temperature of approximately 450° C., preferably using an atomic layer deposition (ALD) method to obtain an amorphous state. Then, a rapid thermal process (RTP) is performed on the semiconductor substrate 200 including the blocking layer 215 formed thereon. The rapid thermal process (RTP) is preferably performed at a temperature of approximately 600° C. or less in order to not affect layers below the blocking layer 215, for example, the tunneling layer 205 and the semiconductor substrate 200. The blocking layer 215 is preferably and illustratively formed of silicon oxide ($SiO_2$) instead of aluminum oxide ($Al_2O_3$), preferably using a chemical vapor deposition (CVD) method.

Figure 4:
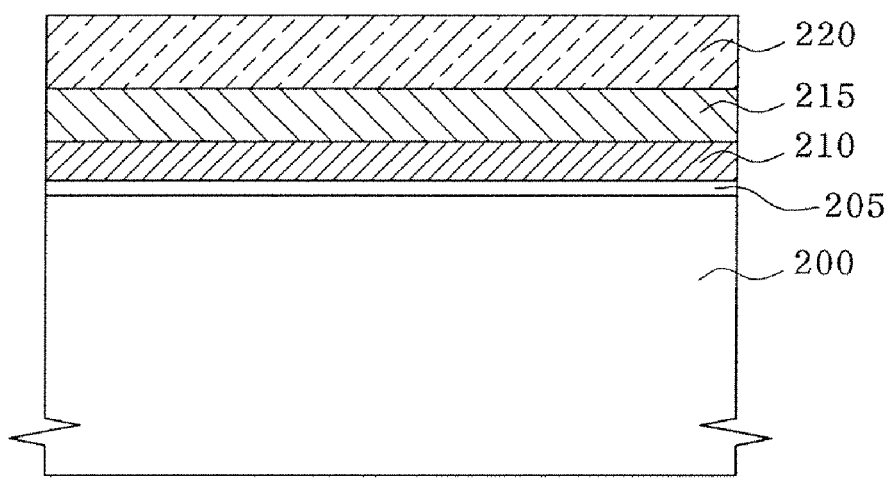

Referring to FIG. 4, the control gate electrode 220 is formed on the blocking layer 215. The control gate electrode 220 is used to apply a predetermined bias voltage such that electrons and charges from a channel region of the semiconductor substrate 200 are trapped within a trap site of the charge trapping layer 210. The control gate electrode 220 is preferably and illustratively formed of a material having a high conductivity, for example, polysilicon or a metal such as tungsten (W).

Figure 5:
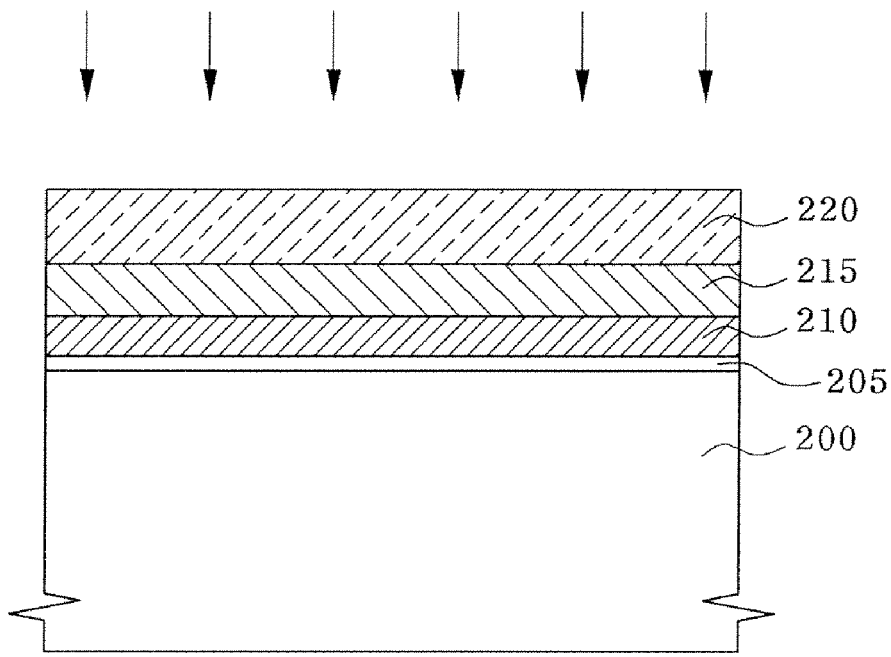

Referring to FIG. 5, the film quality of the blocking layer 215 is densified by performing a thermal treatment process on the semiconductor substrate 200. The thermal treatment process may include a process of heating the blocking layer 215 contacting the control gate electrode 220 by heating the control gate electrode 220 using an induction heating method. Specifically, such an induction heating method uses an electric current related to its magnetic field. According to Lenz's law, a magnetic field is generated by passing an electric current through a coil. The generated magnetic field induces an electric current in a conductor within the coil. When a direct current passes through the coil, an eddy current is not induced in the conductor within the coil. However, when an alternating current passes through the coil, an eddy current is induced in the conductor to cause the self heating of the conductor. According to the induction heating method causing self heating, the control gate electrode 220 having a high conductivity is heated using an induction heating apparatus. The blocking layer 215 contacting the control gate electrode 220 is heated by thermal energy from the control gate electrode 220, thereby crystallizing and densifying the film quality of the blocking layer 215 having an amorphous state. Since induction heating depends on the conductivity of a material, heat transfer is small through the semiconductor substrate 200 having a relatively low conductivity, and thus the semiconductor substrate 200 is substantially not stressed by heat. Accordingly, a high-temperature thermal treatment process is performed on only a desired layer such as the blocking layer 215 while simultaneously minimizing a heat stress on the semiconductor substrate 200. The induction heating method causing self heating may be performed after performing a preheating process on the semiconductor substrate 200. Specifically, the preheating process may include a heating process using a furnace or a process of heating a lower portion of the semiconductor substrate 200. The preheating process maintains the semiconductor substrate 200 at a temperature that does not affect the quality of a lower film, for example, a temperature ranging from approximately 200° C. to approximately 900° C. After that, when the control gate electrode 220 is heated using the induction heating apparatus, a temperature of the control gate electrode 220 having a higher conductivity easily rises above the temperature of the semiconductor substrate 200. As the thermal energy from the control gate electrode 220 is transferred to the blocking layer 215 contacting the control gate electrode 220, the temperature of the blocking layer 215 rises above the temperature of the semiconductor substrate 200 to a temperature ranging from approximately 1100° C. to approximately 1200° C., to densify the film quality of the blocking layer 215. Thus, the film quality of the blocking layer 215 improves programming speed, erasing speed, and the characteristics of data retention in the non-volatile memory device.

The induction heating method causing self heating, and the preheating process is preferably performed in a reducing atmosphere, an oxidizing atmosphere, or an inert atmosphere.

Figure 6:
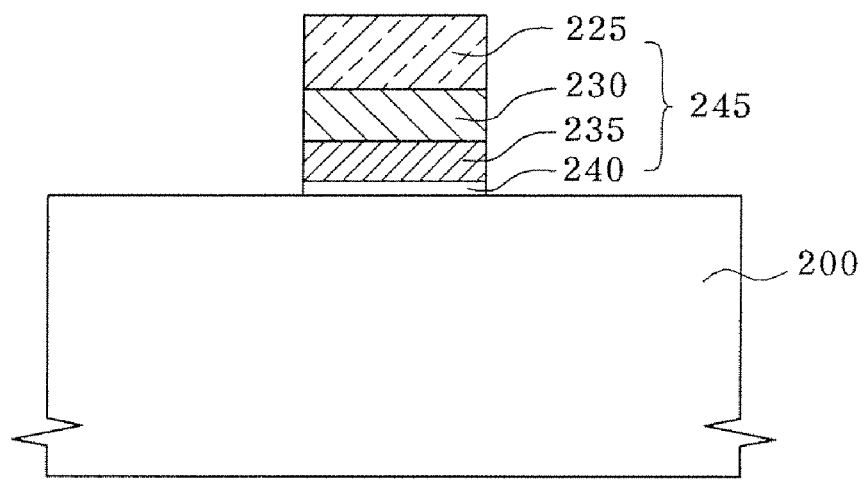

Referring to FIG. 6, a gate stack 245 is formed by patterning the layers 205, 210, 215, and 220 on the semiconductor substrate 200. Specifically, a photoresist pattern (not shown), which defines the gate stack 245, is formed on the control gate electrode 220. Then, the control gate electrode 220, the blocking layer 215, the charge trapping layer 210, and the tunneling layer 205 below the photoresist pattern are etched using the photoresist pattern as a mask. The gate stack 245 includes a control gate electrode pattern 225, a blocking pattern 230, a charge trapping pattern 235, and a tunneling pattern 240.

Although the method for densifying the blocking layer 215 of the non-volatile memory device is described according to the embodiment of the invention, various methods are employed for densifying an insulating layer having an interface in contact with a conductive layer having a high conductivity.

Figure 7A:
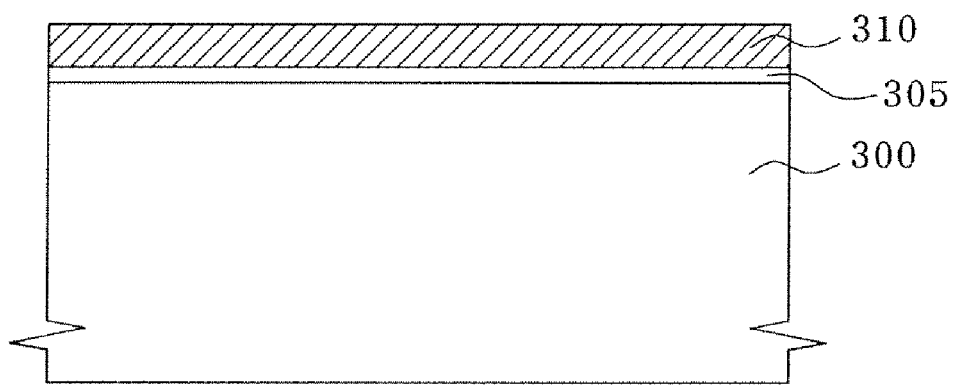
FIGS. 7A to 7C illustrate methods for fabricating a non-volatile memory device with a charge trapping layer according to embodiments of the invention.
Figure 7B:
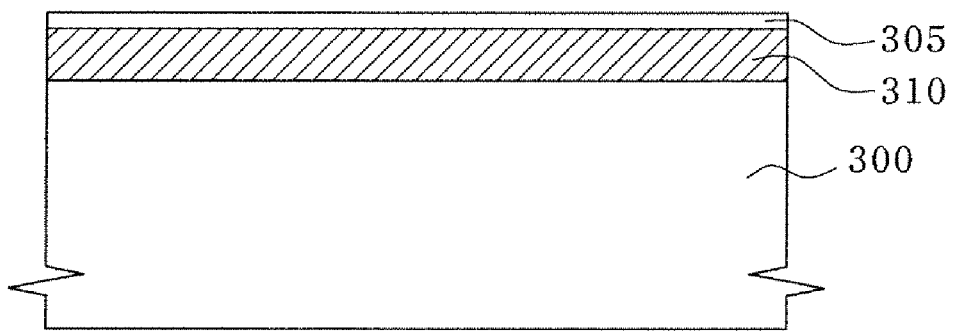
Figure 7C:
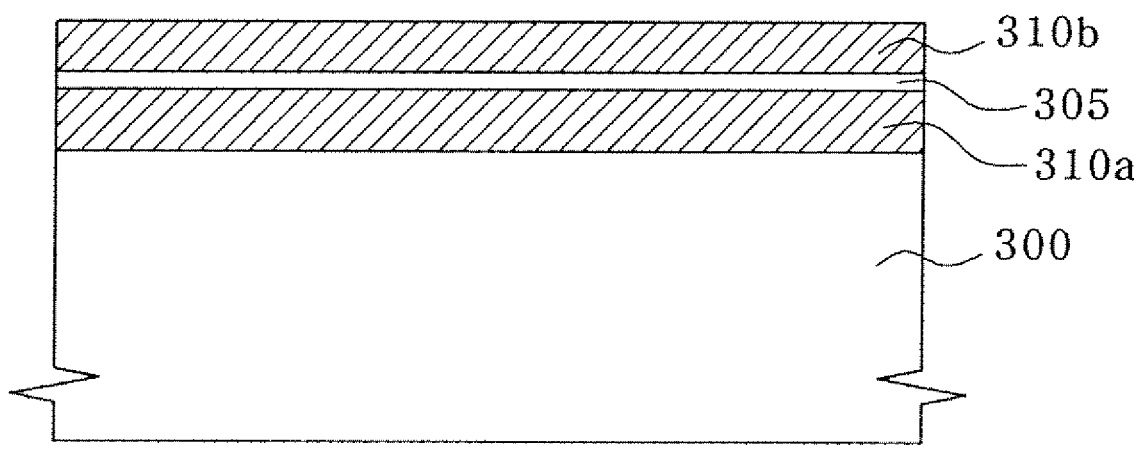

FIGS. 7A to 7C illustrate methods for fabricating a non-volatile memory device with a charge trapping layer according to embodiments of the invention. Referring to FIG. 7A, an insulating layer 305 and a conductive layer 310 are stacked on a semiconductor substrate 300. Alternatively, referring to FIG. 7B, an insulating layer 305 is deposited on a conductive layer 310 formed on a semiconductor substrate 300. Alternatively, referring to FIG. 7C, a first and second conductive layer 310a and 310b are formed on a semiconductor substrate 300, and an insulating layer 305 is disposed between the first and second conductive layers 310*a* and 310*b*. An induction heating method causing self heating is performed on the semiconductor substrate 300 including the conductive layer 310 with any one of the structures. Then, as the temperature of the conductive layer 310 rises the temperature of the insulating layer 305 in contact with the conductive layer 310 rises, thereby densifying the film quality of the insulating layer 305.

While the invention has been described with respect to the specific embodiments, various changes and modifications may be made without departing from the spirit and scope of the invention as defined in the following claims.

What is claimed is:

1. A method for fabricating a non-volatile memory device, the method comprising:
    forming a tunneling layer, a charge trapping layer, a blocking layer, and a control gate electrode over a semiconductor substrate; and
    densifying the blocking layer by applying a magnetic field to the control gate electrode to increase a temperature of the control gate electrode.

2. The method of claim 1, wherein the blocking layer comprises one of an aluminum oxide film and a silicon oxide film.

3. The method of claim 1, further comprising preheating the semiconductor substrate after forming the control gate electrode.

4. The method of claim 3, wherein the preheating comprises one of (a) heating through a furnace and (b) maintaining a temperature of the semiconductor substrate at a temperature ranging from approximately 200° C. to approximately 900° C. by heating a lower portion of the semiconductor substrate.

5. The method of claim 3, comprising preheating in one of an oxidizing atmosphere, a reducing atmosphere, and an inert atmosphere.

6. The method of claim 1, wherein the increasing of the temperature of the control gate electrode comprises:
    disposing the semiconductor substrate on which the control gate electrode formed in an induction heating apparatus; and
    forming the magnetic field by applying an alternating current to the control gate electrode disposed in the induction heating apparatus.

7. A method for fabricating a non-volatile memory device with a charge trapping layer, the method comprising:
    forming a pattern over a semiconductor substrate, the pattern defining an interface between an amorphous insulating layer and a conductive layer; and
    densifying the amorphous insulating layer by applying a magnetic field to the conductive layer to increase a temperature of the conductive layer.

8. The method of claim 7, comprising depositing the insulating layer and the conductive layer over the semiconductor substrate and the pattern defining the interface comprises the insulating layer and the conductive layer.

9. The method of claim 7, comprising depositing the conductive layer and the insulating layer over the semiconductor substrate and the pattern defining the interface comprises the conductive layer and the insulating layer.

10. The method of claim 7, wherein the pattern defining the interface comprises the conductive layer including first and second conductive layers formed over the semiconductor substrate, and the insulating layer disposed between the first and second conductive layers.

11. A method for fabricating a non-volatile memory device, the method comprising:
    forming a tunneling layer, a charge trapping layer, a blocking layer, and a control gate electrode over a semiconductor substrate;
    disposing the semiconductor substrate on which the control gate electrode formed in an induction heating apparatus;
    forming a magnetic field by applying an alternating current to the control gate electrode disposed in the induction heating apparatus; and
    densifying the blocking layer by applying the magnetic field to the control gate electrode to increase a temperature of the control gate electrode.

12. The method of claim 11, wherein the blocking layer comprises one of an aluminum oxide film and a silicon oxide film.

13. The method of claim 11, further comprising preheating the semiconductor substrate after forming the control gate electrode.

14. The method of claim 13, wherein the preheating comprises one of (a) heating through a furnace and (b) maintaining a temperature of the semiconductor substrate at a temperature ranging from approximately 200° C. to approximately 900° C. by heating a lower portion of the semiconductor substrate.

15. The method of claim 13, the comprising preheating in one of an oxidizing atmosphere, a reducing atmosphere, and an inert atmosphere.

* * * * *